(12) United States Patent
Watanabe et al.

(10) Patent No.: US 7,812,439 B2
(45) Date of Patent: Oct. 12, 2010

(54) SEMICONDUCTOR PACKAGE WITH REDUCED LENGTH INTERCONNECT AND MANUFACTURING METHOD THEREOF

(75) Inventors: Mitsuhisa Watanabe, Tokyo (JP); Ichiro Anjo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 140 days.

(21) Appl. No.: 12/169,072

(22) Filed: Jul. 8, 2008

(65) Prior Publication Data
US 2009/0014874 A1  Jan. 15, 2009

(30) Foreign Application Priority Data
Jul. 9, 2007 (JP) ............................ 2007-179562

(51) Int. Cl.
*H01L 23/04* (2006.01)
(52) U.S. Cl. ............... 257/698; 257/786; 257/E23.151; 438/612; 438/666
(58) Field of Classification Search ................. 257/786, 257/698
See application file for complete search history.

(56) References Cited
U.S. PATENT DOCUMENTS
6,137,185 A * 10/2000 Ishino et al. ................. 257/786

2004/0061211 A1* 4/2004 Michii et al. ................. 257/686
2005/0263874 A1* 12/2005 Shimizu et al. ............. 257/700
2006/0261494 A1* 11/2006 Miyazaki et al. ............ 257/779

FOREIGN PATENT DOCUMENTS
JP  9-260536  10/1997

* cited by examiner

*Primary Examiner*—Ajay K Arora
(74) *Attorney, Agent, or Firm*—Young & Thompson

(57) ABSTRACT

A semiconductor apparatus includes a semiconductor chip, a wired board, a plurality of bump electrodes, a plurality of external terminals, and insulating material. The semiconductor chip includes a plurality of electrode pads arranged in a central area on one surface. The wired board is arranged as facing one surface of the semiconductor chip, and includes a wiring. The bump electrode is provided between surfaces at which the semiconductor chip and the wired board face each other, and electrically connects the electrode pad and the wiring. The external terminal corresponds to a plurality of bump electrodes, and is mounted on the wired board. The insulating material is provided between the semiconductor chip and the wired board, and covers at least a connection part between the bump electrode and the wiring. The wiring of the wired board is configured to run in a straight line from a bump electrode-mounted position in a semiconductor chip-mounted surface of the wired board, to an external terminal-mounted surface of the wired board, and also, electrically connect the bump electrode and the corresponding external terminal.

12 Claims, 9 Drawing Sheets

0.75mm
1.75mm

SEMICONDUCTOR PACKAGE WITH REDUCED LENGTH INTERCONNECT AND MANUFACTURING METHOD THEREOF

This application is based upon and claims the benefit of priority from Japanese patent application No. 2007-179562, filed on Jul. 9, 2007, the disclosure of which is incorporated herein in its entirety by reference.

BACKGROUND OF THE INVENTION

1. Field of the Invention

The present invention relates to a semiconductor apparatus configured to electrically connect a semiconductor chip and a wired board, and a producing method of the semiconductor apparatus.

2. Description of the Related Art

Japanese Patent Laid-Open No. 9-260536 (hereinafter, referred to as Patent Document 1) proposes a semiconductor apparatus provided with a semiconductor chip, and a flexible wired board arranged on a main surface of the semiconductor chip through the elastomer.

An aperture part is formed in the flexible wired board, and a lead part of a wiring is arranged in the aperture part. An electrode pad of the semiconductor chip whose surface is directed downward is electrically connected to the lead part.

An external terminal is included on a surface of the flexible wired (hereinafter, referred to as an external terminal-mounted surface) in the opposite side of a surface on which the semiconductor chip is mounted. The electrode pad of the semiconductor chip and the lead part which are arranged in the aperture part of the wired board are covered by sealing material made of insulating resin.

In such a semiconductor apparatus, the electrode pad of the semiconductor chip and the lead part of the wired board are connected in the aperture part provided in the wired board. As a result, an external terminal can not be arranged around just below the electrode pad of the semiconductor chip, for example, within 0.75 mm from just below the electrode pad.

Year by year, since the operation rate of the semiconductor apparatus has been increased, if the distance from the electrode pad of the semiconductor chip, e.g. a wiring length, becomes long, the operation rate may be lowered. Thus, there is a need to largely shorten the wiring length of the semiconductor apparatus to obtain favorable electrical characteristics.

Since the external terminal can not be arranged around just below the electrode pad of the semiconductor chip, the number of the external terminals, which are arranged in an area of the wired board in which the semiconductor chip is mounted, may have been reduced. The number of the external terminals of the semiconductor apparatus has been increased, and it becomes necessary to arrange the external terminals outside the above area, so that the area of the wired board may become larger.

If the area of the wired board becomes larger, a package size of the semiconductor apparatus is enlarged. Further, if the area of the wired boards becomes larger, the number of the wired boards to be produced at a time is decreased when the wired board is produced, and the cost of the wired board is also increased.

In the semiconductor apparatus according to Patent Document 1, the semiconductor chip is mounted on the wired board by using elastomer (elastic material) to improve the reliability of the semiconductor apparatus when the installation to a motherboard and the like is performed.

As described above, it is possible to reduce the stress that is caused by the difference between the thermal expansion coefficients, and to improve the reliability of the semiconductor apparatus when an installation to a motherboard is performed by mounting the semiconductor chip on the wired board by using elastomer. However, the elastomer is expensive material, so that the production cost of the semiconductor apparatus may be increased.

SUMMARY OF THE INVENTION

An object of the present invention is to solve at least one of the above problems included by the semiconductor apparatus according to Patent Document 1. That is, one object of the present invention is to provide a semiconductor apparatus in which favorable electrical characteristics can be obtained, and in which a large number of external electrodes can be arranged. Another object of the present invention is to provide a highly-reliable semiconductor apparatus in which favorable electrical characteristics can be obtained and stress can be reduced.

The semiconductor apparatus according to a first aspect of the present invention includes a semiconductor chip including a plurality of electrode pads arranged in a central area of one surface, a wired board which is arranged as facing the surface of the semiconductor chip, and includes a wiring and a plurality of land parts, a plurality of bump electrodes which are provided between the surfaces of the semiconductor chip and the wired board which face each other, and which electrically connect electrode pad and the wiring, a plurality of external terminals which correspond to a plurality of the bump electrodes, and which are mounted on the land parts of the wired board, and insulating material which is provided between the semiconductor chip and the wired board, and which covers at least a connection part between the bump electrode and the wiring.

The above wiring of the wired board is configured to run in a straight line from a bump electrode-mounted position in a semiconductor chip-mounted surface of the wired board, to an external terminal-mounted surface of the wired board, and to electrically connect the bump electrode and the corresponding external terminal. In addition, the distance in a horizontal direction is set to 0.75 mm or less, the distance being the length from a position at which the bump electrode is mounted on the wired board to a central position of the land part of a plurality of the land parts, said central position being closest to the position at which the bump electrode is mounted.

The semiconductor apparatus according to a second aspect of the present invention includes the semiconductor chip including a plurality of the electrode pads arranged in a central area of one surface, the wired board which is arranged as facing the surface of the semiconductor chip, and includes a wiring, a plurality of the bump electrodes which are provided between the surfaces of the semiconductor chip and the wired board which face each other, and electrically connect the electrode pad and the wiring, a plurality of the external terminals which correspond to a plurality of the bump electrodes, and are mounted on the wired board, and the insulating material which is provided between the semiconductor chip and the wired board, and covers at least the connection part between the bump electrode and the wiring.

The wiring of the wired board is configured to straightly wire from the bump electrode-mounted position in the semiconductor chip-mounted surface of the wired board, to the external terminal-mounted surface of the wired board, and to electrically connect the bump electrode and the corresponding external terminal.

A producing method of the semiconductor apparatus according to a third aspect of the present invention includes:

providing the semiconductor chip which includes a plurality of the electrode pads, and in which a plurality of the bump electrodes are formed on the electrode pads;

providing the wired board, which includes base material, the land parts which correspond to a plurality of the bump electrodes being formed on the base material and being mounted on a plurality of the external terminals, and the wiring being configured to run in a straight line from the bump electrode-mounted position in the semiconductor chip mounted surface of the base material to the external terminal mounted surface of the base material, and electrically connecting the bump electrode and the corresponding land part;

mounting the semiconductor chip on the wired board by flip chip-bonding so that a wire runs in a straight line from the bump electrode-mounted position to the external terminal-mounted surface of the wired board; and forming the external terminal in the land part of the wired board.

The above and other objects, features and advantages of the present invention will become apparent from the following description with reference to the accompanying drawings which illustrate examples of the present invention.

DETAILED DESCRIPTION OF THE EXEMPLARY EMBODIMENT

Exemplary Embodiment 1

Figure 1:
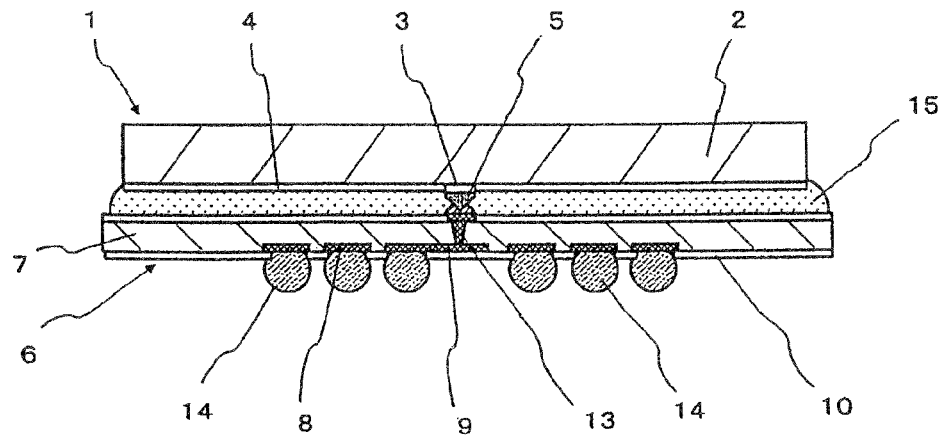
FIG. 1 is a cross-section diagram illustrating a package structure of a semiconductor apparatus according to exemplary embodiment 1 of the present invention.
Figure 2:
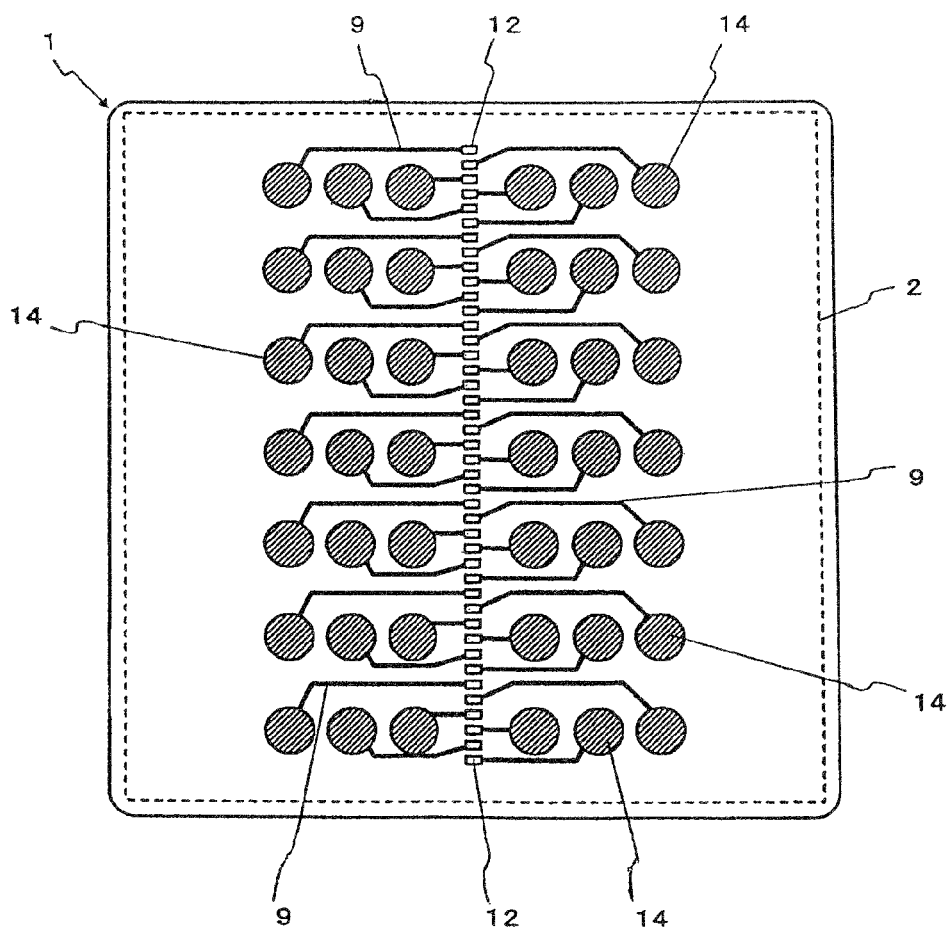
FIG. 2 is a plane diagram illustrating schematically an arrangement of a land part of a wired board used in the semiconductor apparatus according to the exemplary embodiment 1 of the present invention.
Figure 3:
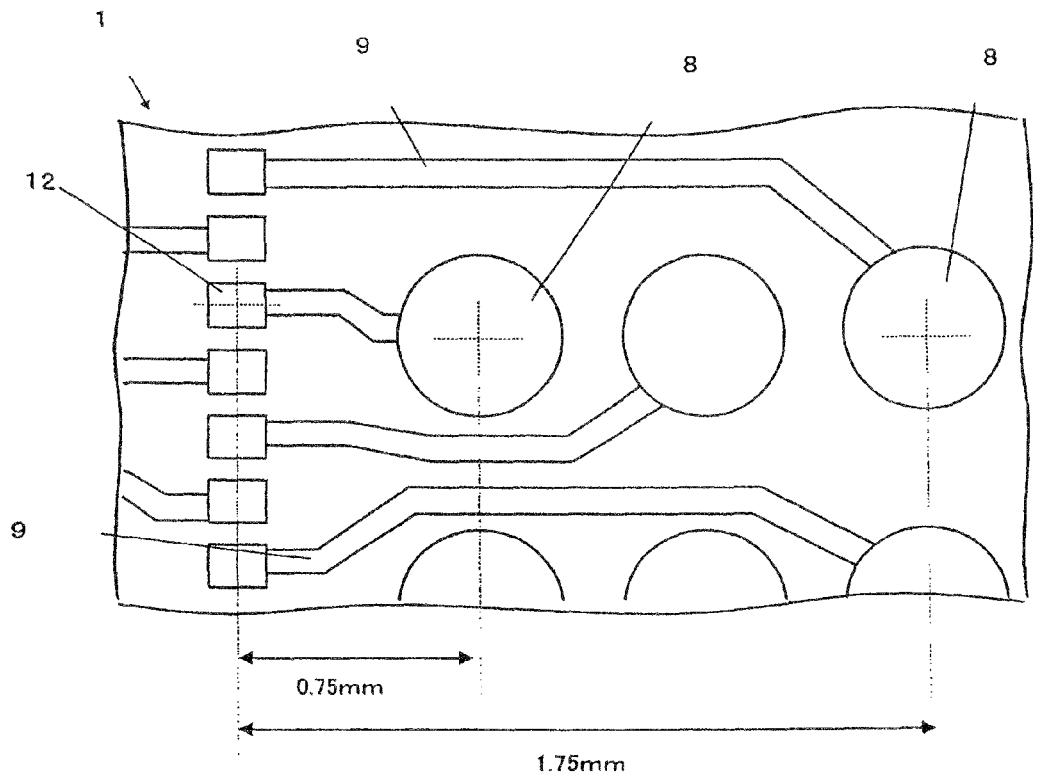
FIG. 3 is a plane diagram of a main part for describing the position at which the land part in exemplary embodiment 1 is arranged.
Figure 4:
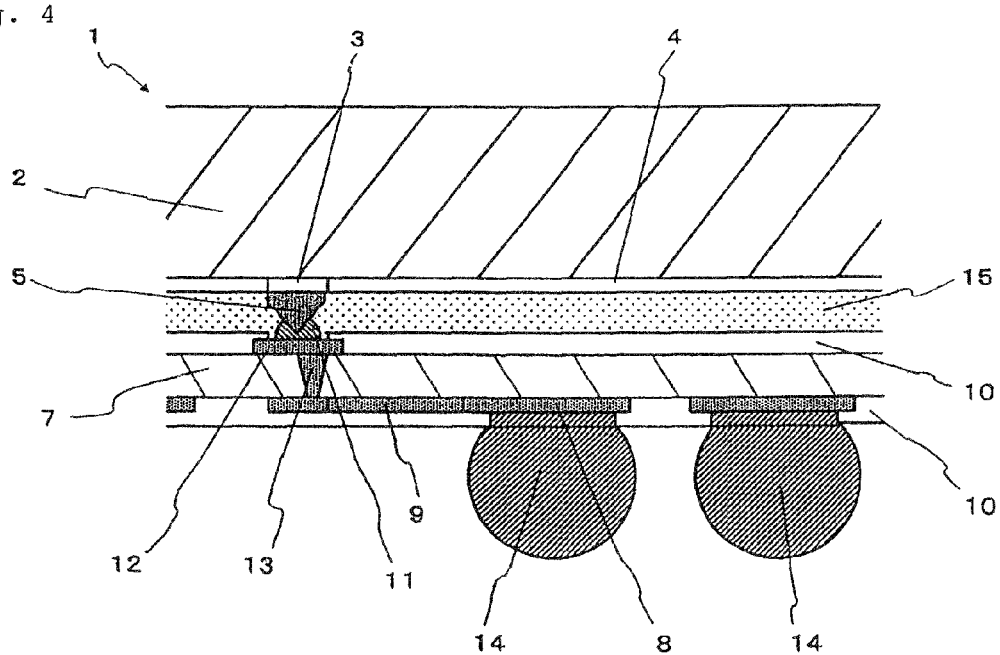
FIG. 4 is a cross-section diagram of a main part for describing the position at which the land part in exemplary embodiment 1 is arranged.

FIG. 1 is a cross-section diagram illustrating a package structure of a semiconductor apparatus according to an exemplary embodiment 1 of the present invention, and FIG. 2 is a plane diagram illustrating schematically an arrangement of a land part of a wired board used in the semiconductor apparatus according to the exemplary embodiment 1 of the present invention. FIG. 3 and FIG. 4 are diagrams for describing the position at which the land part of the exemplary embodiment is arranged, and FIG. 3 is a plane diagram of a main part, and FIG. 4 is a cross-section diagram of a main part.

Referring to FIG. 1 to FIG. 4, the shape of semiconductor apparatus 1 according to the exemplary embodiment is a roughly-square plate, and semiconductor apparatus 1 includes semiconductor chip 2 in which a predetermined circuit is formed on one surface. Semiconductor apparatus 1 includes a plurality of electrode pads 3 arranged in a roughly-central area, e.g. arranged to one line in a central area in one surface side of semiconductor chip 2.

Passivation film 4, which is an insulating protection film, is formed on one surface of semiconductor chip 2 excluding electrode pad 3, and protects the circuit-formed surface of semiconductor chip 2.

In semiconductor chip 2, a circuit is formed, for example, a logic circuit such as a microprocessor, or a memory circuit such as an SRAM (Static Random Access Memory) and a DRAM (Dynamic Random Access Memory).

Bump electrodes 5 that are to be connected to an after-mentioned wired board are formed on a plurality of electrode pads 3 formed on semiconductor chip 2 respectively. Bump electrode 5 is, for example, formed by ultrasonic thermal compression-bonding a wire on electrode pad 3, in which a ball is formed at a melted tip, and by breaking the wire.

Wired board 6, in which a predetermined wiring is formed, is arranged at a location facing one surface of semiconductor chip 2.

Wired board 6 is, for example, a tape-like wired board, and a plurality of land parts 8 for connecting after-mentioned external terminals, and connection wiring (including connection pad 12, through wiring 13, and wiring 9) for connecting land part 8 and bump electrode 5 formed on electrode pad 3 of semiconductor chip 2 are formed on tape base material 7 made of polyimide resin, and the like.

Wiring 9 is formed in an external terminal mounted-surface side of wired board 6, bump electrode 5-mounted position (connection pad 12) is formed in an opposite surface side of the external terminal-mounted surface. Insulating protection film, e.g. solder resist 10, is provided on a surface of tape base material 7 excluding land part 8 and connection pad 12.

Semiconductor chip 2 is mounted on wired board 6, and bump electrode 5 and connection pad 12 are electrically connected by using conductive material 11 (for example, solder).

Through wiring 13 connected to connection pad 12 is formed in wired board 6. Through wiring 13 is formed so as to straightly (like a straight line) pass through from connection pad 12 to the external terminal mounted-surface side of wired board 6, and electrically connects bump electrode 5 connected to connection pad 12 and external terminal 14 corresponding to bump electrode 5. Thereby, the wiring from bump electrode 5 on semiconductor chip 2 to external terminal 14 that corresponds to such a bump electrode 5 can become the shortest, and the operation rate of semiconductor apparatus 1 can be increased.

Through wiring 13 is formed in such a shape, e.g. a wedge-like shape in which the wire width becomes wider as the wiring runs from the external terminal mounted-surface side to semiconductor chip 2 mounted-surface side of wired board 6. Thereby, semiconductor chip 2 can be favorably connected to connection pad 12 just upon through wiring 13 by the flip chip-bonding.

Land parts 8 of wired board 6 are, for example, arranged as corresponding to a plurality of electrode pads 3 linearly arranged in the central area of semiconductor chip 2. In the exemplary embodiment, three lines of land parts 8 are arranged roughly parallel to a line of connection pad 12 in each of both sides of the line of connection pad 12 connected to electrode pad 3 respectively so that a plurality of land parts 8 are arranged in a grid-like pattern on the external terminal-mounted surface. Obviously, the number of lines of land parts 8 is not limited to three lines in the present invention.

In the exemplary embodiment, for example, as for the position of land part 8 of the line which is the closest to a line of connection pad 12, a distance in a horizontal direction is set to 0.75 mm or less in wired board 6, the distance being a length from a central position of arbitrary connection pad 12 to a central position of land part 8 connected to corresponding connection pad 12, as illustrated in FIG. 3. Thereby, it become possible to provide external terminal 14 in an area in which the aperture part is provided like the semiconductor apparatus according to Patent Document 1, and to arrange external terminal 14 in a high density in the external terminal-mounted surface. Thereby, it is possible to increase the number of pins the semiconductor apparatus 1.

In addition, since a center to center distance in a horizontal direction is set to 0.75 mm or less as described above, the distance being a length from a line of connection pad 12 to a line of land part 8 which is the closest to the line of connection pad 12, as illustrated in FIG. 3, land part 8 of the third line from the line of connection pad 12 can also be arranged at a position around 1.7 mm from the line of connection pad 12.

As described above, since the position of land part 8 of the first line by the line of connection pad 12 is set to the position 0.75 mm or less away from the line of connection pad 12, and since through wiring 13 of wired board 6 is roughly linearly wired from connection pad 12, to which bump electrode 5 is connected, to the external terminal-mounted surface of wired board 6, a wiring distance can be shortened from electrode pad 3 of semiconductor chip 2 to external terminal 14 (refer to FIG. 4).

As described above, since the wiring is realized so that the wiring distance from electrode pad 3 arranged in the central area of semiconductor chip 2 to land part 8 on wired board 6 in a horizontal direction and a height direction of semiconductor apparatus 1 becomes the shortest, noise can be reduced.

In addition, since the distance of the line which is the closest to this connection pad 12 is shortened from connection pad 12 to land part 8, the wiring distance of the second and third lines from connection pad 12 to land parts 8 can be also shortened, and the operation rate of semiconductor apparatus 1 can be improved. External terminal 14 can be also arranged in a higher density.

As is apparent from FIG. 1 and FIG. 2, land part 8 is configured not to be arranged in the surrounding area of wired board 6 in which stress is concentrated in the case of the installation of semiconductor apparatus 1, for example at a position around an edge part of semiconductor chip 2. As a result, the reliability of the installation of semiconductor apparatus 1 can be improved.

A plurality of external terminals 14 for installation on a motherboard, and the like are arranged on land part 8 provided on wired board 6. External terminal 14 is, for example, formed by mounting a ball made of solder, or the like on land part 8 through the use of flux, or the like, and by reflowing the ball.

External terminal 14, whose diameter is, for example, 0.35 mm, is arranged in a grid-like pattern having 0.5 mm pitch on wired board 6, so that external terminal 14 is also downsized.

Underfill material 15, which is insulating material, is provided between semiconductor chip 2 and wired board 6. Such underfill material 15 is filled in a space between semiconductor chip 2 and wired board 6, and is formed so as to protect the circuit-formed surface of semiconductor chip 2 and the connection part between electrode pad 3 of semiconductor chip 2 and wired board 6. As described above, since insulating material 15 is provided so as to fill the space between semiconductor chip 2 and wired board 6, it is possible to protect the surface of semiconductor chip 2 and to improve the capability for installing semiconductor apparatus 1. Meanwhile, in the exemplary embodiment, while insulating material 15 is provided so as to fill the space between semiconductor chip 2 and wired board 6, insulating material 15 may be configured so as to cover at least only the connection part between electrode pad 3 of semiconductor chip 2 and wired board 6. In this configuration, there exists such an advantageous effect in which the adhesive area between semiconductor chip 2 and wired board 6 becomes small, so that the stress that is applied to semiconductor apparatus 1 is reduced when semiconductor apparatus 1 is installed on the motherboard, and the like.

Producing Method of Exemplary Embodiment 1

Next, a manufacturing method of semiconductor apparatus 1 according to exemplary embodiment 1 of the present invention will be described by referring to FIG. 5 and FIG. 6.

First, a semiconductor wafer is provided to manufacture semiconductor apparatus 1, in which desired circuits and electrode pads are formed through a diffusion process on one surface of a disk-like substrate obtained by, for example, slicing a silicon ingot formed by a single crystal pulling method, or the like.

As illustrated in FIG. 5(A), while semiconductor wafer 16 is being placed and fixed on supporting material such as adhesive UV tape (dicing tape) 17, bump electrode 5 is formed on each electrode pad 3. Bump electrode 5 is, for example, formed on electrode pad 3 by ultrasonic thermal compression-bonding a wire in which a ball is formed at a melted tip, and by breaking the wire.

Next, as illustrated in FIG. 5(B), semiconductor wafer 16 is moved to a dicing process while being fixed by UV tape 17. Dicing line 19 between semiconductor chips 2 is rotation-grinded with high rate-rotating dicing blade 18, and semiconductor wafer 16 is cut and separated into a plurality of semiconductor chips 2. The dicing is, for example, executed by the full cutting. After cutting, UV tape 17 is UV-radiated, and while the adhesive force is being reduced, semiconductor chip 2 is pushed up by pushing up means (not-illustrated) from the lower side to be removed from UV tape 17, and is picked up. Thereby, semiconductor chip 2 is obtained, in which bump electrode 5 is formed on each electrode pad 3. Picked-up semiconductor chip 2 is stored in the product storing part of carrier jig 21 by transferring means such as absorbing collet 20 as illustrated in FIG. 5(C).

As illustrated in FIG. 5(D), in semiconductor chip 2 stored in carrier jig 21, underfill material 15 is selectively applied on electrode pad 3 by potting apparatus 22. Meanwhile, underfill material 15 may be applied before semiconductor wafer 16 is diced. Alternatively, after wired board 6 is mounted on separated semiconductor chip 2, underfill material 15 is poured into a space between wired board 6 and semiconductor chip 2, thereby, underfill material 15 may be applied on electrode pad 3.

Wired board 6 used in the exemplary embodiment is processed by the TAB (Tape Automated Bonding) method, and a unit frame structure configured in wired board 6 is configured as follows.

Figure 6:
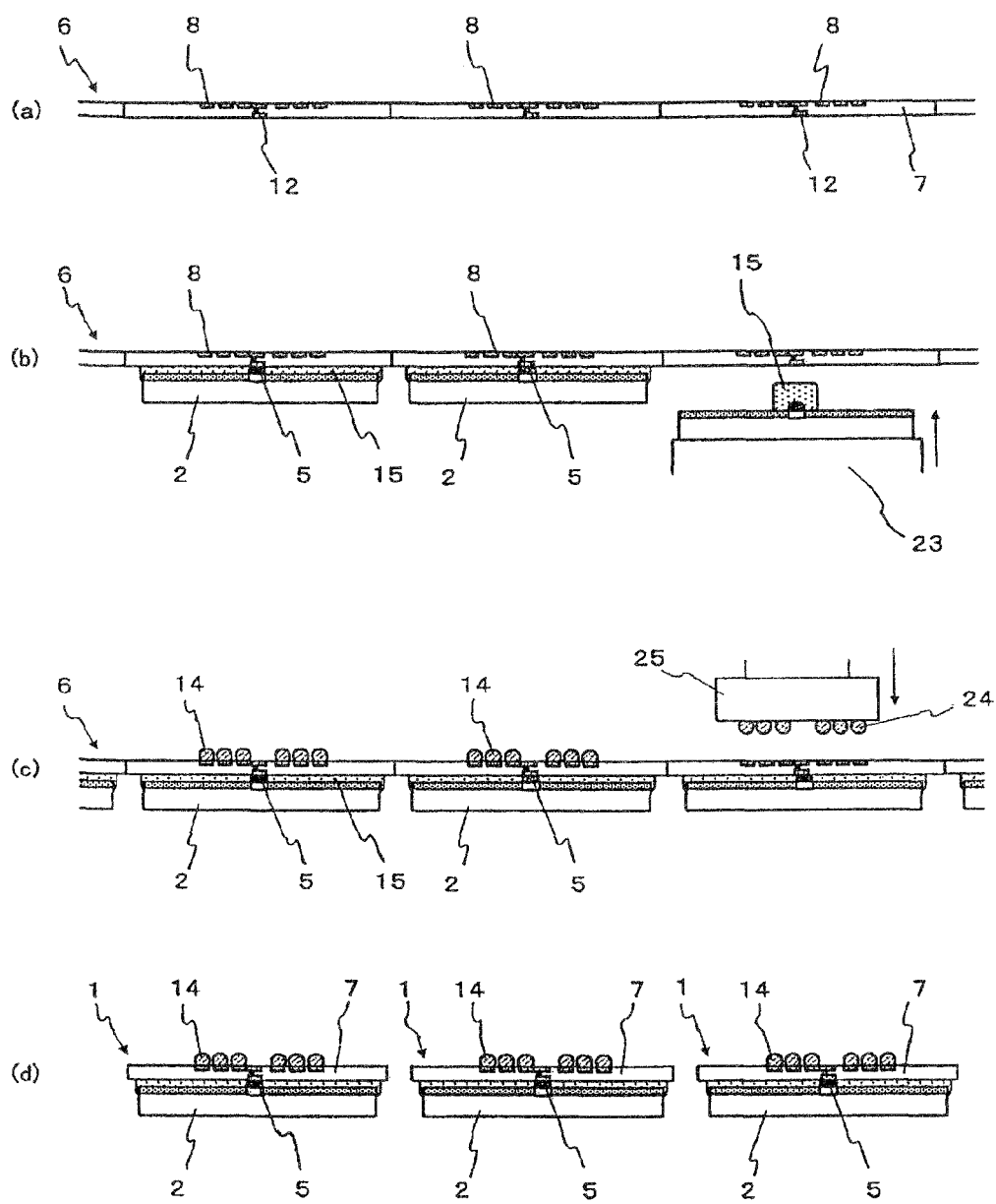
FIG. 6 is a process diagram for describing a manufacturing method of the semiconductor apparatus according to the exemplary embodiment 1 of the present invention.

As illustrated in FIG. 6 (A), in the unit frame structure, a plurality of land parts 8 arranged in a grid-like pattern to connect the external terminal which will be mentioned later, and wiring 9 for connecting land part 8 and bump electrode 5 formed on electrode pad 3 of semiconductor chip 2, are formed on tape base material 7 made of polyimide resin, and the like. Through wiring 13 is formed in wired board 6, and is connected to the bump electrode 5-mounted part (connection pad 12). Through wiring 13 is formed so as to straightly (in a straight line) pass through from connection pad 12 to the external terminal mounted-surface side of wired board 6, and electrically connects bump electrode 5 connected to connection pad 12 and external terminal 14 that corresponds to bump electrode 5. Wired board 6 is provided, in which a plurality of such unit frame structures are continuously formed.

In the dibonding process, semiconductor chip 2 is, for example, mounted on wired board 6 that is set from a reel to a reel. Specifically, as illustrated in FIG. 6 (B), semiconductor chip 2 is mounted on wired board 6 that is set by the flip chip-bonding. In the flip chip-bonding, while semiconductor chip 2 is being held by positioning stage 23, connection pad 12 of wired board 6 and bump electrode 5 are aligned, and connection pad 12 and bump electrode 5 are electrically connected through conductive adhesive material 11, thereby, semiconductor chip 2 is mounted on wired board 6. Since semiconductor chip 2 is mounted on board 6, underfill material 15 is expanded, and roughly the entire surfaces of semiconductor chip 2 and wired board 6 are held and fixed. Thereby, since the connection part between bump electrode 5 and wired board 6, and the space between semiconductor chip 2 and wired board 6 are covered by underfill material 15, it is possible to protect the connection part and to install wired board 6 on the motherboard, or the like without bending. Meanwhile, while being absorbed and held, not by positioning stage 23, but by absorbing collet 20, or the like, semiconductor chip 2 may be configured to be flip chip-bonded to wired board 6.

Since through wiring 13 is formed in wired board 6 so as to straightly pass through from the bump electrode 5-mounted position (connection pad 12) to the external terminal mounted-surface side of wired board 6, bump electrode 5 and external terminal 14 can be connected using the shortest wiring.

Semiconductor chip 2 mounted on wired board 6 is moved to the ball-mounting process. Specifically, as illustrated in FIG. 6 (C), conductive ball 24 is mounted on land part 8 on wired board 6, and a plurality of external terminals 14 are formed. In this ball-mounting process, by using absorbing mechanism 25 in which a plurality of absorbing holes are formed according to the arrangement of land part 8 on wired board 6, ball 24 which is, for example, made of solder, or the like is held at the absorbing hole. The flux is transcription-formed on held ball 24, and balls 24 are mounted together on land parts 8 on wired board 6. After ball 24 is mounted, external terminal 14 is fixed on land part 8 by reflowing balls 24.

After wired board 6 in which external terminal 14 is formed is processed in a cutting process and a marking process, semiconductor apparatus 1 as illustrated in FIG. 6 (D) is obtained. Thereby, it is possible to efficiently manufacture semiconductor apparatus 1 in which the wiring is realized so that the wiring distance in the plane surface direction and the height direction becomes the shortest.

Figure 7:
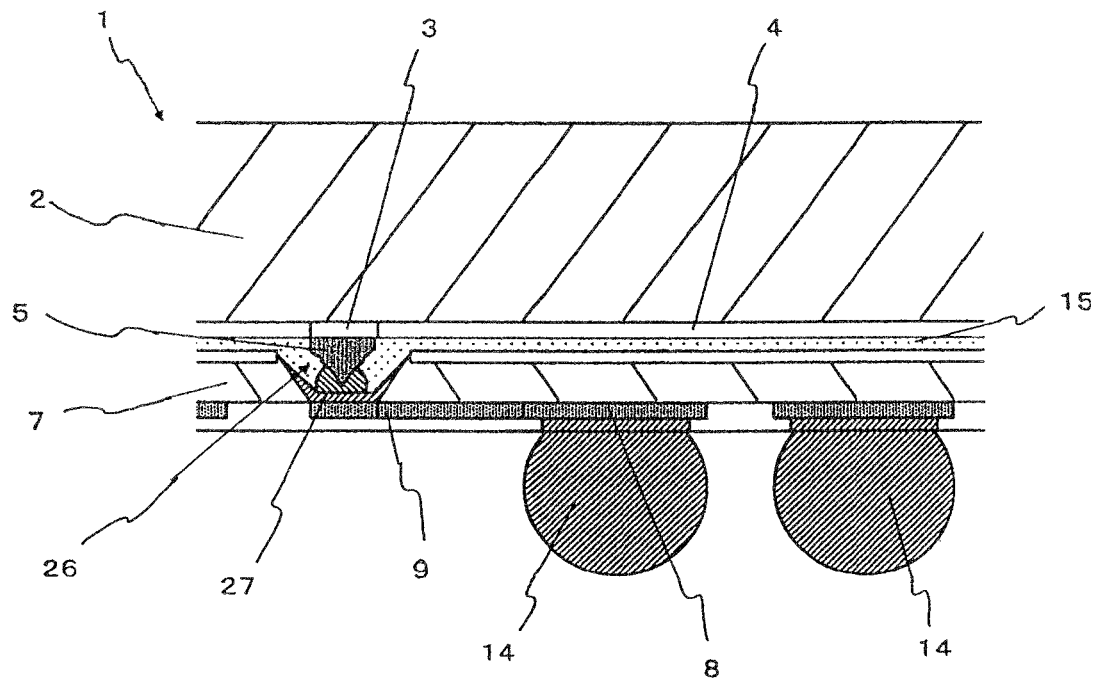
FIG. 7 is a modified example of the exemplary embodiment 1, and is a cross-section diagram illustrating a connection structure between a bump electrode of a semiconductor chip and the wired board.

Next, a modified example of semiconductor apparatus 1 according to exemplary embodiment 1 of the present invention will be described. FIG. 7 is the modified example of the exemplary embodiment, and is a cross-section diagram illustrating the connection structure between bump electrode 5 of semiconductor chip 2 and wired board 6.

The feature of semiconductor apparatus 1 of this modified example is that hole part 26 is provided at a position of wired board 6 corresponding to bump electrode 5 respectively. Hole part 26 is formed to the extent that bump electrode 5 can be arranged, for example, in a size of around 50 μm. Hole part 26 is formed so as to expose wiring 9 formed in the external terminal mounted-surface side of wired board 6. Bump electrode 5 is connected from hole part 26 to wiring 9 in the external terminal mounted-surface side of wired board 6 through conductive adhesive material 11, e.g. solder, or the like. As described above, hole part 26 is provided in the bump electrode 5-mounted position of wired board 6, bump electrode 5 is electrically connected to wiring 9 in the external terminal mounted-surface side through hole part 26, thereby, bump electrode 5 is linearly and electrically connected to the external terminal-mounted surface of wired board 6. Thereby, it is possible to further shorten the wiring distance in a height direction from electrode pad 3 to external terminal 14. In addition, in the exemplary embodiment, since wiring 9 and bump electrode 5 are connected through hole part 26, an external form of semiconductor apparatus 1 can be thinned. Since the wiring can be shortened from electrode pad 3 to external terminal 14, the processing rate of semiconductor apparatus 1 can be increased more.

In addition, since wiring 9 in hole part 26 is provided with plating 27 of Cu/Ni/Au, and the like, the electrical connection between semiconductor chip 2 and wired board 6 can be caused to be favorable. Since hole part 26 is provided in the electrical connection part between semiconductor chip 2 and wired board 6, the adhesive area between semiconductor chip 2 and wired board 6 can be enlarged. In hole part 26 of wired board 6, the slope part is formed on a side surface in hole part 26, in which the hole diameter becomes wider as the hole runs from the external terminal mounted surface to the semiconductor chip mounted surface side. Thereby, the adhesive capability between bump electrode 5 and wiring 9 of wired board 6 can be improved.

Exemplary Embodiment 2

Figure 8:
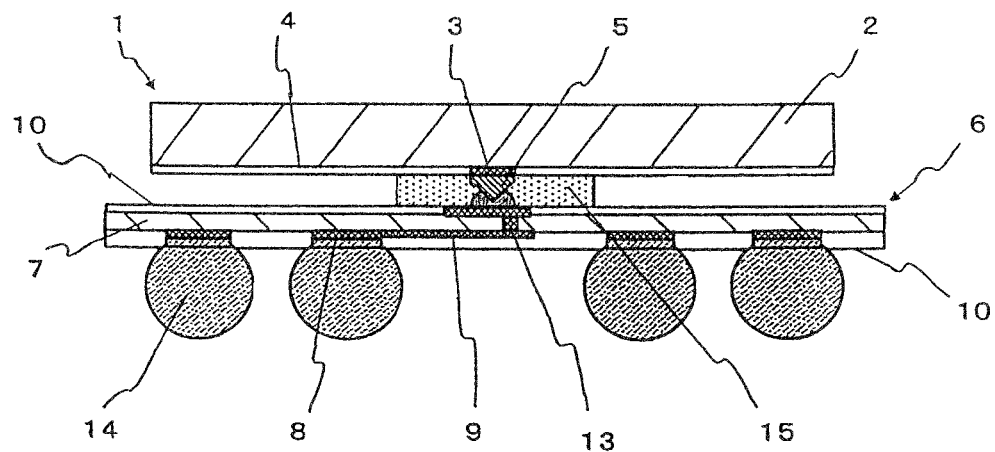
FIG. 8 is a cross-section diagram illustrating the package structure of the semiconductor apparatus according to exemplary embodiment 2 of the present invention.
Figure 9:
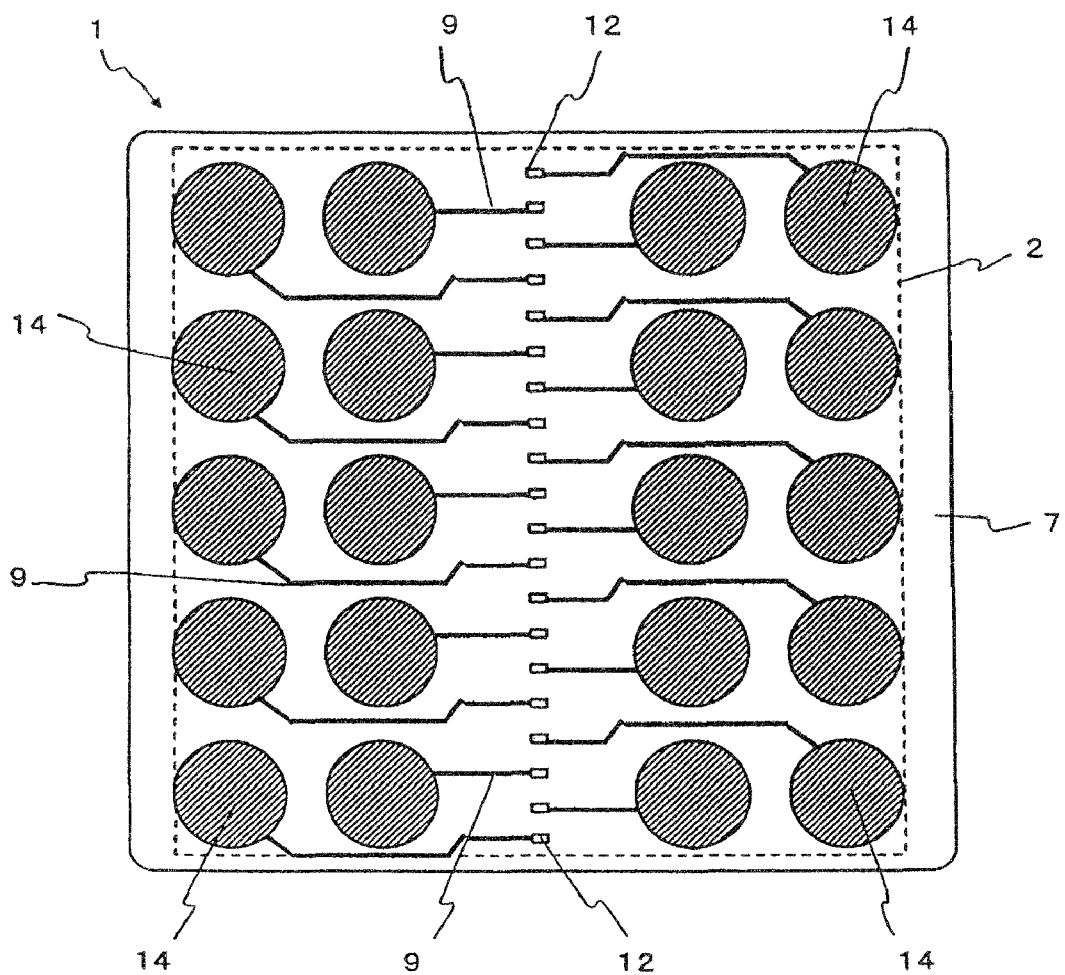
FIG. 9 is a plane diagram illustrating schematically an arrangement of the land part of the wired board used in the semiconductor apparatus according to the exemplary embodiment 2 of the present invention is.

FIG. 8 is a cross-section diagram illustrating a package structure of semiconductor apparatus 1 according to exemplary embodiment 2 of the present invention, and FIG. 9 is a plane diagram illustrating schematically the arrangement of land part 8 of wired board 6 used for semiconductor apparatus 1 according to exemplary embodiment 2 of the present invention.

Referring to FIG. 8 and FIG. 9, semiconductor apparatus 1 of the exemplary embodiment is roughly square plate like and includes semiconductor chip 2 in which a predetermined circuit is formed on one surface. Semiconductor apparatus 1 includes a plurality of electrode pads 3 arranged to one line in a roughly-central area in one surface side of semiconductor chip 2. Passivation film 4, which is an insulating protection film, is formed on one surface of semiconductor chip 2, and protects the circuit-formed surface of semiconductor chip 2.

Bump electrode 5 for connection to an wired board which will be mentioned later is formed on each of a plurality of electrode pads 3 formed on semiconductor chip 2. Bump electrode 5 is, for example, formed on electrode pad 3 by ultrasonic thermal compression-bonding a wire in which a ball is formed at its melted tip, and by breaking the wire.

Wired board 6, in which a predetermined wiring is formed, is arranged at a location facing one surface of semiconductor chip 2. Wired board 6 is, for example, a tape-like wired board, and a plurality of land parts 8 for connecting external terminals which will be mentioned later, and connection wiring (including connection pad 12, through wiring 13, and wiring 9) for connecting land part 8 and bump electrode 5 formed on electrode pad 3 of semiconductor chip 2 are formed on tape base material 7 made of polyimide resin, and the like.

Wiring 9 is formed in an external terminal mounted-surface side of wired board 6, and the bump electrode 5-mounted position (connection pad 12) is formed in the opposite surface side of the external terminal-mounted surface. Insulating protection film, e.g. solder resist 10, is provided on a surface of tape base material 7 excluding land part 8 and connection pad 12.

Semiconductor chip 2 is mounted on wired board 6, and bump electrode 5 and connection pad 12 are electrically connected through conductive material 11 (e.g. solder).

Through wiring 13 connected to connection pad 12 is formed in wired board 6. Through wiring 13 is formed so as to straightly (like a straight line) pass through from connection pad 12 to the external terminal mounted-surface side of wired board 6, and electrically connects bump electrode 5 connected to connection pad 12 and external terminal 14 corresponding to bump electrode 5. Thereby, the wiring from bump electrode 5 on semiconductor chip 2 to external terminal 14 corresponding to such a bump electrode 5 can become the shortest, and the operation rate of semiconductor apparatus 1 can be increased.

Land parts 8 of wired board 6 are, for example, arranged as corresponding to a plurality of electrode pads 3 linearly arranged in the central area of semiconductor chip 2. In the exemplary embodiment, two lines of land parts 8 are arranged roughly parallel to a line of connection pad 12 along both sides of the line of connection pad 12 connected to electrode pad 3 respectively so that a plurality of land parts 8 are arranged in a grid-like pattern on the external terminal-mounted surface. Obviously, the number of lines of land parts 8 is not limited to two lines in the present invention.

A plurality of external terminals 14 for installation on a motherboard, and the like are arranged on land part 8 provided on wired board 6. External terminal 14 is, for example, formed by mounting a ball made of solder, or the like on land part 8 by using flux, or the like, and reflowing the ball.

Underfill material 15, which is insulating sealing material, is provided between semiconductor chip 2 and wired board 6. It is enough that underfill material 15 is arranged so as to cover at least the connection part between bump electrode 5 and connection pad 12. In the exemplary embodiment, underfill material 15 covers only the connection part between electrode pad 3 of semiconductor chip 2 and wired board 6, and the adjacent part as well. As described above, since the insulating material, which covers the connection part between semiconductor chip 2 and wired board 6, is configured to be as small as possible, it is possible to reduce the stress which is applied to semiconductor chip 2 that is caused by the difference between the thermal expansion coefficients when semiconductor apparatus 1 is installed to the motherboard. Thereby, the reliability of semiconductor apparatus 1 can be improved. Meanwhile, the insulating sealing material may be provided so as to fully fill the space between semiconductor chip 2 and wired board 6 to protect one surface of semiconductor chip 2. Since the above sealing material is provided so as to fully fill the space between semiconductor chip 2 and wired board 6, tape-like wired board 6 can be installed without bending when semiconductor apparatus 1 is installed.

Producing Method of Exemplary Embodiment 2

Next, referring to FIG. 10, a manufacturing method of semiconductor apparatus 1 according to exemplary embodiment 2 of the present invention will be described.

Figure 5:
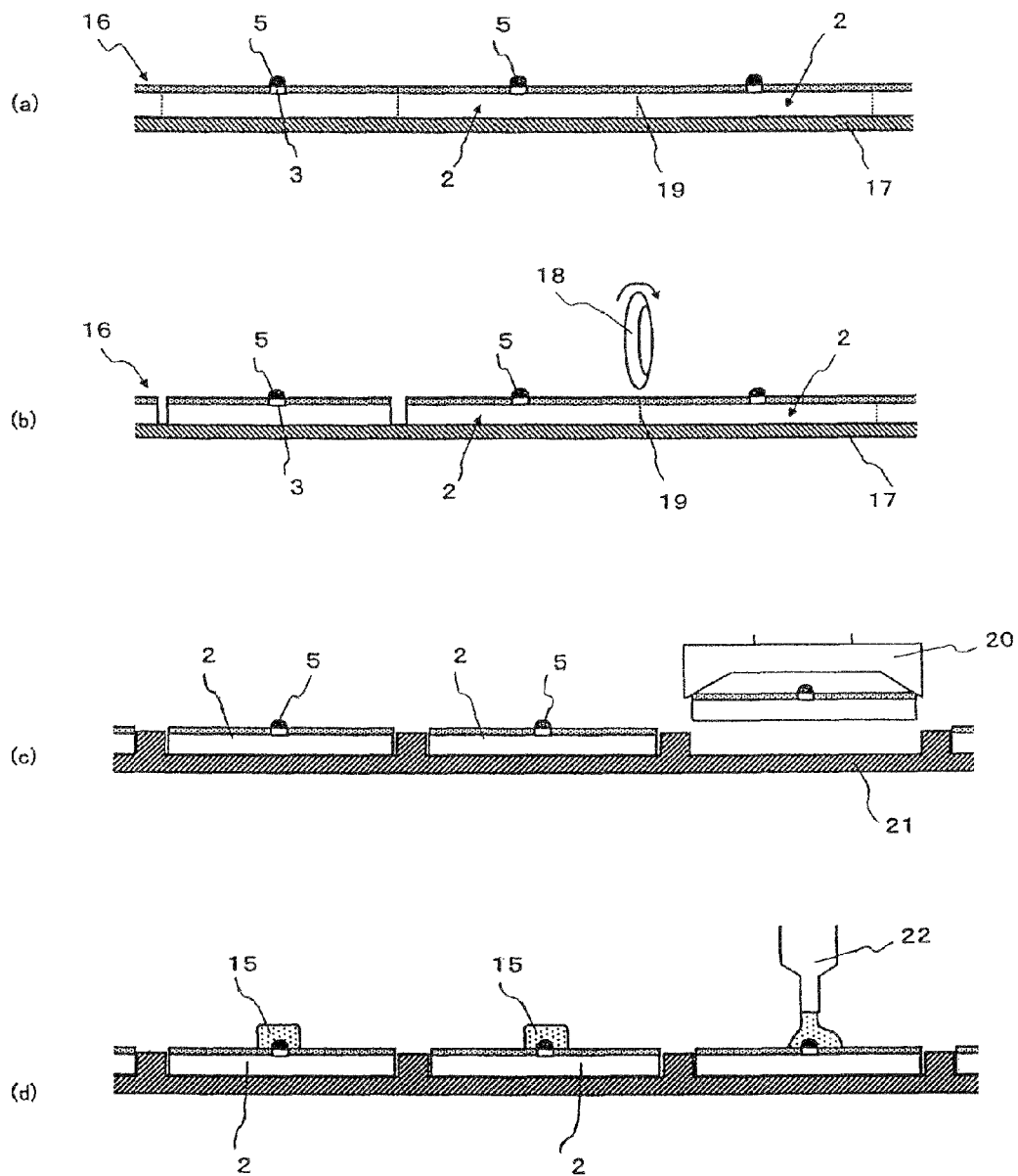
FIG. 5 is a process diagram for describing a manufacturing method of the semiconductor apparatus according to exemplary embodiment 1 of the present invention.

First, as in exemplary embodiment 1, semiconductor chip 2 is provided in which bump electrode 5 is formed on each electrode pad 3 (FIGS. 5 (A) and (B)).

Wired board 6 used in the exemplary embodiment is processed by the TAB (tape Automated Bonding) method, and a unit frame structure configured in wired board 6 is configured as follows.

Figure 10:
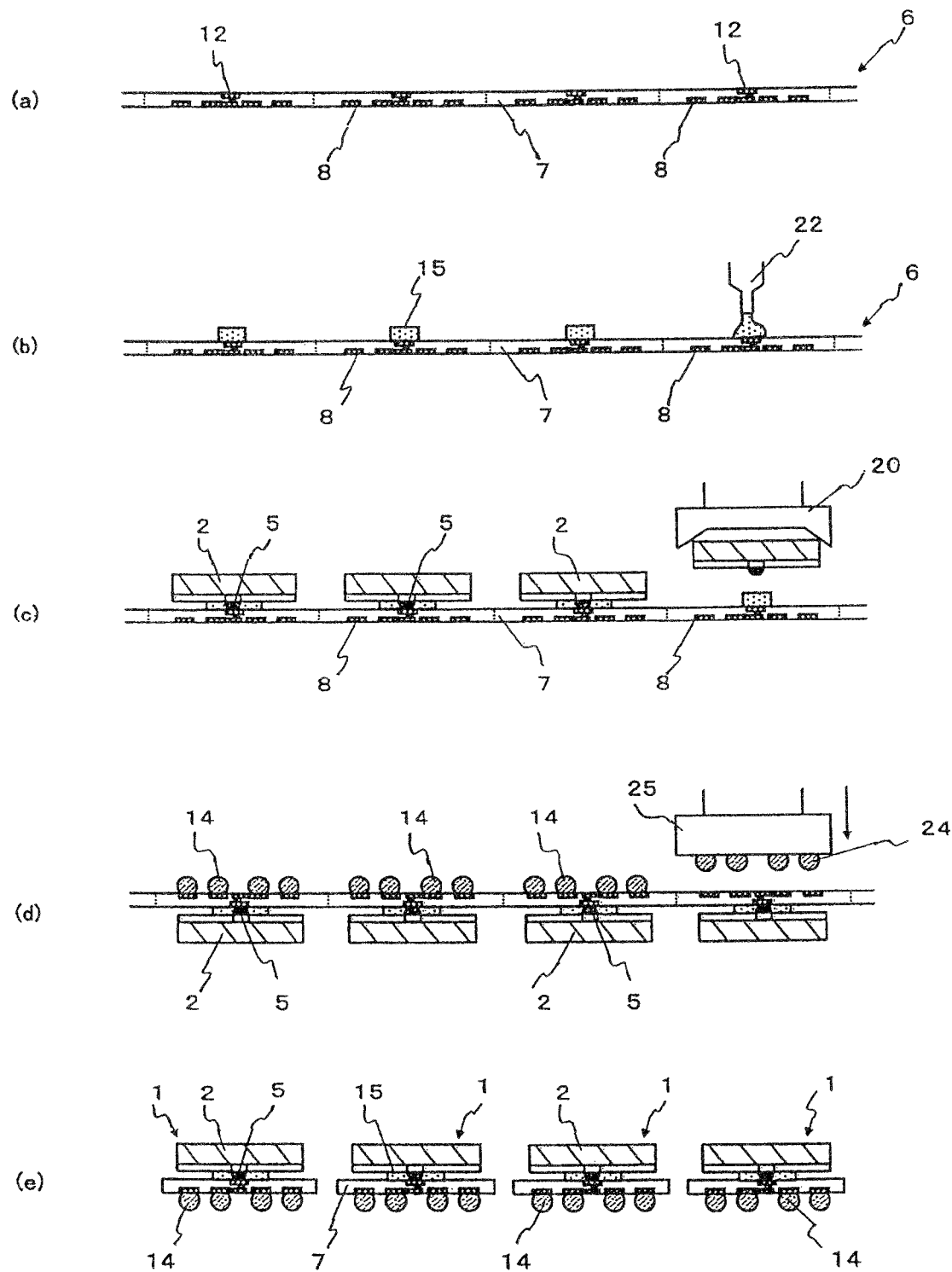
FIG. 10 is a process diagram for describing a manufacturing method of the semiconductor apparatus according to exemplary embodiment 2 of the present invention.

As illustrated in FIG. 10 (A), in the unit frame structure, a plurality of land parts 8 arranged in a grid-like pattern to connect an external terminal which will be mentioned later, and wiring 9 for connecting land part 8 and bump electrode 5 formed on electrode pad 3 of semiconductor chip 2 are formed on tape base material 7 made of polyimide resin, and the like. Through wiring 13 is formed in wired board 6, and is connected to the bump electrode 5-mounted part (connection pad 12). Through wiring 13 is formed so as to straightly pass through from connection pad 12 to the external terminal mounted-surface side of wired board 6, and connects bump electrode 5 connected to connection pad 12 and external terminal 14 that corresponds to bump electrode 5. Wired board 6 is provided in which a plurality of such unit frame structures are continuously formed.

Wired board 6 is set form a reel to a reel, and as illustrated in FIG. 10 (B), insulating sealing material, e.g. underfill material 15 is selectively applied by potting means 22 to the electrode pad 3-mounted position (connection pad 12) of semiconductor chip 2. Meanwhile, underfill material 15, may be applied not to wired board 6, but to the side of semiconductor chip 2 side. Alternatively, after semiconductor chip 2 is mounted on wired board 6, underfill material 15 is poured into the space between wired board 6 and semiconductor chip 2, thereby, the connection part between bump electrode 5 and connection pad 12 may be covered.

Wired board 6 to which underfill material 15 is applied is moved to the dibonding process. In the dibonding process, as illustrated in FIG. 10 (C), semiconductor chip 2 is mounted on wired board 6 by flip chip-bonding. In flip chip-bonding, while semiconductor chip 2 is being vacuum-absorbed by absorbing collet 20, or the like, connection pad 12 of wired board 6 and bump electrode 5 are aligned, and connection pad 12 and bump electrode 5 are electrically connected through conductive adhesive material 11, thereby, semiconductor chip 2 is mounted on wired board 6. Since semiconductor chip 2 is mounted on wired board 6, underfill material 15 holds and fixes the connection part between semiconductor chip 2 and wired board 6, and the adjacent part as well. Thereby, the area of the connection part between semiconductor chip 2 and wired board 6 becomes smaller, and the stress applied to semiconductor apparatus 1 can be reduced when semiconductor apparatus 1 is installed to the motherboard and the like.

Since through wiring 13 is formed in wired board 6 so as to straightly pass through from the bump electrode 5-mounted position (connection pad 12) to the external terminal mounted-surface side of wired board 6, bump electrode 5 can be connected to external terminal 14 with the shortest wiring.

Semiconductor chip 2 mounted on wired board 6 is moved to the ball-mounting process. Specifically, as illustrated in FIG. 10 (D), conductive ball 24 is mounted on land part 8 on wired board 6, and a plurality of external terminals 14 are formed. In this ball-mounting process, by using absorbing mechanism 25 in which a plurality of absorbing holes are formed according to the allocation of land part 8 on wired board 6, ball 24 which is for example, made of solder, or the like is held at the absorbing hole. The flux is transcription-formed on held ball 24, and balls 24 are mounted together on land parts 8 on wired board 6. After ball 24 is mounted, external terminal 14 is fixed on land part 8 by reflowing ball 24.

After wired board 6 in which external terminal 14 is formed is processed in the cutting process and the marking process, semiconductor apparatus 1 as illustrated in FIG. 10 (E) is obtained. Thereby, it is possible to efficiently manufacture semiconductor apparatus 1 in which the wiring is realized so that the wiring distance becomes the shortest from electrode pad 3 to external terminal 14. Since only the connection part between semiconductor chip 2 and wired board 6, and the adjacent position are held and fixed by underfill material 15, the stress applied to semiconductor apparatus 1 can be reduced when such semiconductor apparatus 1 is installed. Since the stress is reduced in semiconductor apparatus 1 of the present invention, without using the elastomer used for the semiconductor apparatus described in Patent Document 1, the manufacturing cost of semiconductor apparatus 1 can be reduced.

Figure 11:
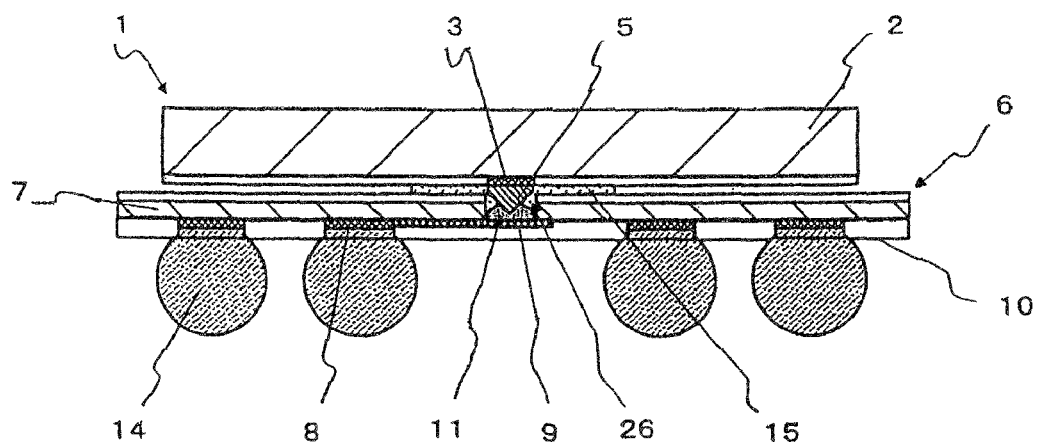
FIG. 11 is a modified example of the exemplary embodiment 2, and is a cross-section diagram illustrating a connection structure between the bump electrode of the semiconductor chip and the wired board.
Figure 12:
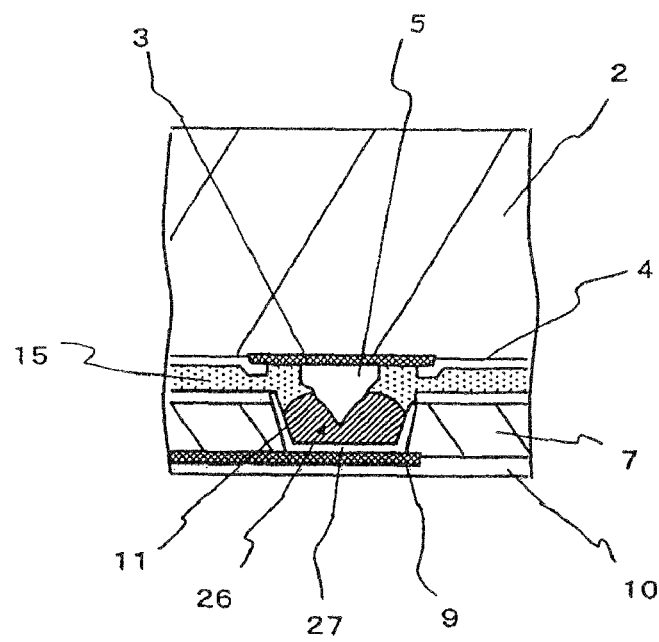
FIG. 12 is a main part-expanded diagram of FIG. 11.

Next, a modified example of semiconductor apparatus 1 according to exemplary embodiment 2 of the present invention will be described. FIG. 11 is the modified example of exemplary embodiment 2, and is a cross-section diagram illustrating the connection structure between bump electrode 5 of semiconductor chip 2 and wired board 6. FIG. 12 is a main part-expanded diagram of FIG. 11.

The configuration of semiconductor apparatus 1 as illustrated in FIG. 11 is the same as that of above exemplary embodiment 2 excluding the connection structure between bump electrode 5 of semiconductor chip 2 and wired board 6. Referring to FIG. 11 and FIG. 12, hole part 26 is provided at a position of wired board 6 that corresponds to bump electrode 5 respectively. Hole part 26 may be large to the extent that bump electrode 5 can be arranged. Hole part 26 is formed so as to expose wiring 9 formed in the external terminal mounted-surface side of wired board 6. Bump electrode 5 is connected from hole part 26 to wiring 9 in the external terminal mounted-surface side of wired board 6 through conductive adhesive material 11. As described above, hole part 26 is provided at the bump electrode 5-mounted position of wired board 6, and bump electrode 5 is electrically connected to wiring 9 in the external terminal mounted-surface side through hole part 26, thereby, bump electrode 5 is linearly and electrically connected to the external terminal-mounted surface of wired board 6. Thereby, the wiring distance in a height direction from electrode pad 3 to external terminal 14 can be further shortened. In addition, in the exemplary embodiment, since wiring 9 and bump electrode 5 are connected through hole part 26, the external shape of semiconductor apparatus 1 can be made thinner. Since wiring 9 from electrode pad 3 to external terminal 14 can be shortened, the processing rate of semiconductor apparatus 1 can be increased.

Since wiring 9 in hole part 26 is provided with plating 27 of Cu/Ni/Au, and the like, the electrical connection between semiconductor chip 2 and wired board 6 can be caused to be preferable. Since hole part 26 is provided in the electrical connection part between semiconductor chip 2 and wired board 6, the adhesive area between semiconductor chip 2 and wired board 6 can be enlarged.

Figure 13:
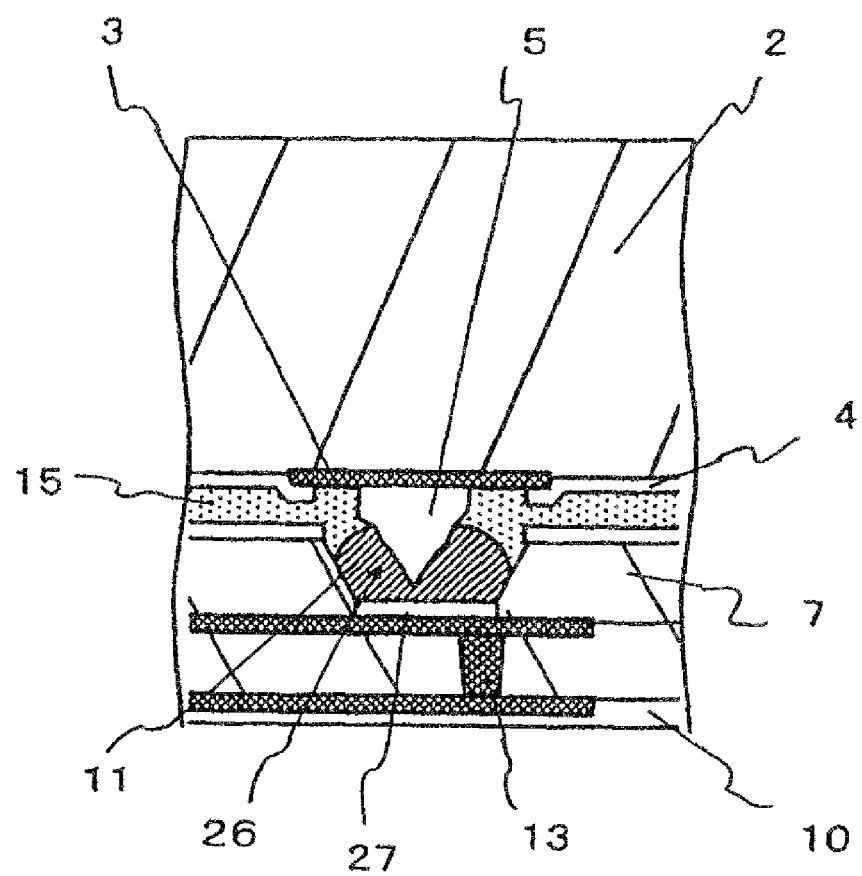
FIG. 13 is a cross-section diagram illustrating the wired board in a multilayer wired structure which can be applied to the present invention.

FIG. 13 illustrates an example in which wired board 6 in a multilayer wiring structure is applied in semiconductor apparatus 1 of the exemplary embodiment 2. Since a multilayer wiring board is used for wired board 6 as illustrated in FIG. 13, higher density wiring can be achieved. This aspect can also be applied to exemplary embodiment 1.

As described above, the invention made by the present inventor has been described based on the exemplary embodiments, the present invention is not limited to the above exemplary embodiments, and it is apparent that a variety of changes and modifications can be applied without departing from the concept of the present invention. For example, while such a case has been described in the exemplary embodiment in which a plurality of electrode pads 3 are provided in the central area of semiconductor chip 2, the technique of the present invention can also be applied to the semiconductor chip in which electrode pads 3 are provided in a chip surrounding area.

While such a case has been described in the exemplary embodiment in which tape-like wired board 6 is used, a rigid board such as a glass epoxy board may also be used.

Meanwhile, the advantageous effects obtained by the representative inventions of inventions disclosed by the present specification will be simply described as follows.

The semiconductor chip, which includes a plurality of electrode pads arranged in a central area of one surface, is mounted on the wired board with the bump electrodes provided on the electrode pads. The above wiring of the wired board is configured to run in a straight line from a bump electrode-mounted position in a semiconductor chip-mounted surface of the wired board to an external terminal-mounted surface of the wired board, and to electrically connect the bump electrode and the corresponding external terminal. In addition, a distance in a horizontal direction is set to 0.75 mm or less, the distance being a length from a position at which the bump electrode is mounted on the wired board to a central position of the land part of a plurality of the land parts, the central position being closest to the position at which the bump electrode is mounted.

Since the semiconductor apparatus is configured as described above, it becomes possible to devise a wiring configuration so that the wiring distance is the shortest in the plane surface direction and in the height direction, and noise can be reduced. In addition, it is possible to connect with the external terminal by using the shortest wiring, and to increase the processing rate of the semiconductor apparatus. Since the distance from the bump electrode-mounted position to the land part of the line, which is the closest to the bump electrode mounted position, is shortened as much as possible, the wiring distance to the land parts of the second line and the third line from the bump electrode-mounted position can be also shortened, and the density of the external terminal can be increased.

Since the land part can be configured not to be arranged in the surrounding area of the wired board in which the stress is concentrated in the case of the installation to a motherboard, for example, in the adjacent position of the edge part of the semiconductor chip, the reliability when the semiconductor apparatus is installed to the motherboard can be improved.

Since the semiconductor chip and the wired board are held and fixed as covering only the connection part between the semiconductor chip and the wired board and the adjacent position, with the insulating material and without using the elastomer, it is possible to reduce the stress applied when the semiconductor apparatus is installed to a motherboard, and it is also possible to reduce the manufacturing cost of the semiconductor apparatus.

Since the hole part is formed at the bump electrode-mounted position of the wired board, and the bump electrode is electrically connected to the wiring part in the external terminal mounted-surface side through the hole part, the bump electrode is inserted in the hole part, so that the external shape of the semiconductor apparatus can be made thinner. Thereby, it is possible to further shorten the wiring from the electrode pad to the external terminal, and to increase the processing rate of the semiconductor apparatus. The adhesive area between the semiconductor chip and the wired board becomes larger, and the reliability of the connection can also be increased.

In addition, since the above wired board is caused to be a flexible wired board, the semiconductor apparatus can be made thinner.

While preferred embodiments of the present invention have been described using specific terms, such description is for illustrative purposes only, and it is to be understood that changes and variations may be made without departing from the spirit or scope of the following claims.

What is claimed is:

1. A semiconductor apparatus, comprising:
a semiconductor chip including a plurality of electrode pads in a central area of one surface;
a wired board facing one surface of the semiconductor chip, the wired board including a plurality of connection pads in a central part of the facing surface and that are respectively aligned with the plurality of electrode pads in the central area of the semiconductor chip;
a plurality of bump electrodes between surfaces of the semiconductor chip and the wired board facing each other, and which electrically connect respective ones of the electrode pads and the connection pads;
a plurality of external terminals which correspond to a plurality of the bump electrodes, and which are mounted on the wired board spaced laterally from the central part on a surface opposite the facing surface remote from the plurality of connection pads; and
insulating material between the semiconductor chip and the wired board,
wherein the wired board includes a plurality of first wirings that each runs in a straight line through the wired board from a respective one of the connection pads directly to the opposite surface of the wired board, and a plurality of second wirings that each runs across the opposite surface of the wired board and connects a respective one of the first wirings to a respective one of the external terminals so that each of the electrode pads is connected to a respective one of the external terminals.

2. The semiconductor apparatus according to claim 1, wherein the insulating material covers at least an area between the bump electrodes and the connection pads.

3. The semiconductor apparatus according to claim 1, wherein each first wiring is wider at the respective connection pad than at a connection to the second wiring.

4. The semiconductor apparatus according to claim 1, wherein the first wiring runs through the wired board in a hole part that includes a slope part on a side surface in the hole part, in which a hole diameter becomes wider as the hole part runs from the external terminal mounted-surface side to the semiconductor chip-mounted surface side of the wired board.

5. The semiconductor apparatus according to claim 1, wherein the wired board is a flexible wired board.

6. The semiconductor apparatus according to claim 1,
wherein the connection pads are aligned in a linear array and the external terminals are aligned in plural rows perpendicular to the linear array, and wherein a distance in a horizontal direction from a middle of the linear array to a middle of a nearest one of the external terminals in each of the rows is set to 0.75 mm or less.

7. The semiconductor apparatus according to claim 6, wherein the external terminals have a diameter of approximately 0.35 mm, and are arranged in a grid-like pattern having a 0.5 mm pitch.

8. The semiconductor apparatus according to claim 1, wherein the connection pads are aligned in a straight linear array and the external terminals are aligned in plural straight rows substantially perpendicular to an axis of the linear array, each of the rows having plural ones of the external terminals.

9. The semiconductor apparatus according to claim 1, wherein the insulating material is provided between the central area of the semiconductor chip and the central part of the wired board to reduce an adhesive area between the semiconductor chip and the wired board.

10. A semiconductor producing method, comprising:
providing a semiconductor chip which includes a plurality of electrode pads in a central area of one surface;
providing a wired board, the wired board including a plurality of connection pads in a central part of a surface facing the one surface of the semiconductor chip and that are respectively aligned with the plurality of electrode pads in the central area of the semiconductor chip;
providing a plurality of the bump electrodes on respective ones of the electrode pads of the semiconductor chip;
providing first wirings that each runs in a straight line through the wired board from a respective one of the connection pads directly to a surface of the wired board opposite the facing surface;
mounting the semiconductor chip on the wired board by flip chip bonding to electrically connect each of the electrode pads with a respective one of the connection pads via a respective one of the bump electrodes; and
mounting a plurality of external terminals on the wired board spaced laterally from the central part remote from the connection pads on the opposite surface of the wired board, each of the plurality of external terminals being connected to a respective one of the first wirings by a second wiring that runs across the opposite surface of the wired board, so that each of the electrode pads is connected to a respective one of the external terminals.

11. The semiconductor producing method according to claim 10, wherein the connection pads are aligned in a linear array and the external terminals are aligned in plural rows perpendicular to the linear array.

12. The semiconductor producing method according to claim 11, wherein a distance in a horizontal direction from a middle of the linear array to a middle of a nearest one of the external terminals in each of the rows is set to 0.75 mm or less.

* * * * *